(12) United States Patent
Lopez

(10) Patent No.: US 11,005,012 B2
(45) Date of Patent: May 11, 2021

(54) WAVELENGTH CONVERTED LIGHT EMITTING DEVICE WITH TEXTURED SUBSTRATE

(71) Applicant: Lumileds LLC, San Jose, CA (US)

(72) Inventor: Toni Lopez, Aachen (DE)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 15/769,134

(22) PCT Filed: Oct. 10, 2016

(86) PCT No.: PCT/US2016/056284
§ 371 (c)(1),
(2) Date: Apr. 18, 2018

(87) PCT Pub. No.: WO2017/069964
PCT Pub. Date: Apr. 27, 2017

(65) Prior Publication Data
US 2018/0315901 A1 Nov. 1, 2018

Related U.S. Application Data

(60) Provisional application No. 62/243,470, filed on Oct. 19, 2015.

(51) Int. Cl.
*H01L 33/50* (2010.01)
*H01L 33/58* (2010.01)
(Continued)

(52) U.S. Cl.
CPC .......... *H01L 33/505* (2013.01); *H01L 33/502* (2013.01); *H01L 33/58* (2013.01);
(Continued)

(58) Field of Classification Search
CPC ......... H01L 33/58; H01L 33/54; H01L 33/50; H01L 33/505; H01L 33/502; H01L 33/508; H01L 33/0079; F21K 9/64; F21K 9/66
See application file for complete search history.

(56) References Cited

U.S. PATENT DOCUMENTS 8,461,616 B2 6/2013 Zeiler et al.
2005/0151141 A1 7/2005 Grotsch et al.
(Continued)

FOREIGN PATENT DOCUMENTS

CN 1886841 A 12/2006
CN 102347428 A 2/2012
(Continued)

OTHER PUBLICATIONS

Notification from the EPO as the ISA, of "The International Search Report and the Written Opinion of the International Searching Authority", dated Nov. 23, 2016, 13 pages.

*Primary Examiner* — Kevin Parendo

(57) ABSTRACT

Embodiments of the invention include a flip chip semiconductor light emitting device and a wavelength converting structure disposed in a path of light extracted from the flip chip semiconductor light emitting device. A substrate with a textured top surface is positioned with the bottom surface facing the wavelength converting structure. The wavelength converting structure is disposed between the substrate and the flip chip semiconductor light emitting device.

19 Claims, 3 Drawing Sheets

(51) Int. Cl.
*H01L 33/56* (2010.01)
*H01L 33/60* (2010.01)
*H01L 33/48* (2010.01)

(52) U.S. Cl.
CPC .......... *H01L 33/486* (2013.01); *H01L 33/56* (2013.01); *H01L 33/60* (2013.01); *H01L 2933/0041* (2013.01); *H01L 2933/0083* (2013.01); *H01L 2933/0091* (2013.01)

(56) References Cited

U.S. PATENT DOCUMENTS

| | | | | |
|---|---|---|---|---|
| 2007/0085103 | A1* | 4/2007 | Nishioka | H01L 33/507 257/99 |
| 2007/0126017 | A1* | 6/2007 | Krames | C04B 35/44 257/98 |
| 2009/0173958 | A1* | 7/2009 | Chakraborty | H01L 33/501 257/98 |
| 2011/0260184 | A1 | 10/2011 | Furuyama | |
| 2012/0026720 | A1* | 2/2012 | Cho | G02B 5/0242 362/84 |
| 2012/0086023 | A1 | 4/2012 | Veerasamy et al. | |
| 2012/0112218 | A1* | 5/2012 | Teng | H01L 33/38 257/98 |
| 2012/0223351 | A1* | 9/2012 | Margalit | H01L 33/382 257/98 |
| 2013/0015482 | A1 | 1/2013 | Su | |
| 2013/0194795 | A1* | 8/2013 | Onaka | F21V 5/04 362/231 |
| 2013/0207141 | A1* | 8/2013 | Reiherzer | H01L 33/505 257/98 |
| 2013/0258634 | A1 | 10/2013 | Xu et al. | |
| 2014/0016299 | A1 | 1/2014 | Tran et al. | |
| 2014/0103391 | A1 | 4/2014 | Haruta et al. | |
| 2016/0027975 | A1* | 1/2016 | Kitamura | H01L 33/56 438/27 |
| 2016/0308089 | A1* | 10/2016 | Kim | H01L 33/0095 |

FOREIGN PATENT DOCUMENTS

| | | |
|---|---|---|
| DE | 102008025756 | 12/2009 |
| EP | 1528603 | 5/2005 |
| EP | 2615652 | 7/2013 |
| JP | 2005-166734 A | 6/2005 |
| JP | 2005-209795 A | 8/2005 |
| JP | 2008-251561 | 10/2008 |
| TW | 201351721 A | 12/2013 |
| WO | 2014/203793 | 12/2014 |
| WO | 2014/203793 A1 | 12/2014 |

* cited by examiner

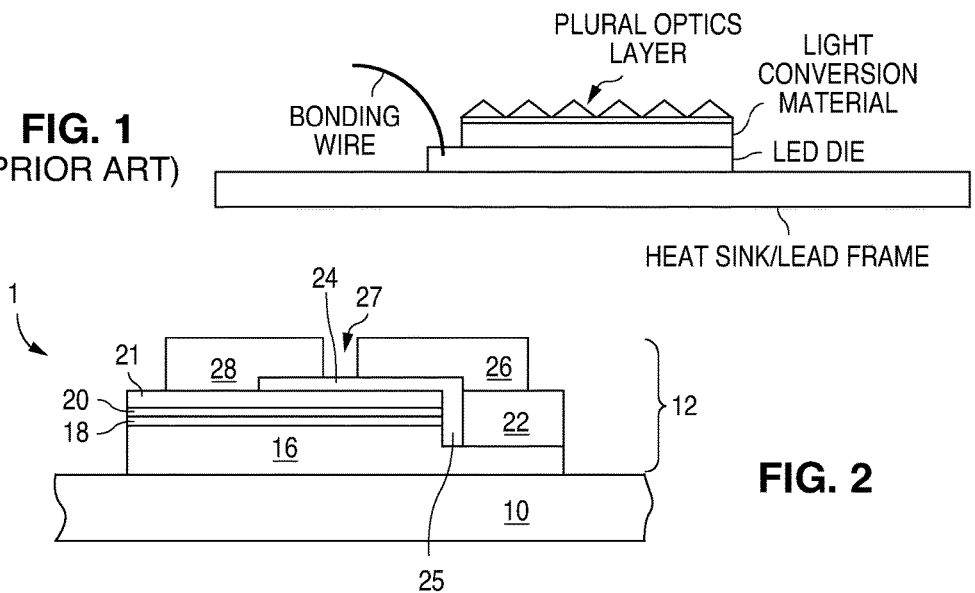
FIG. 1
(PRIOR ART)
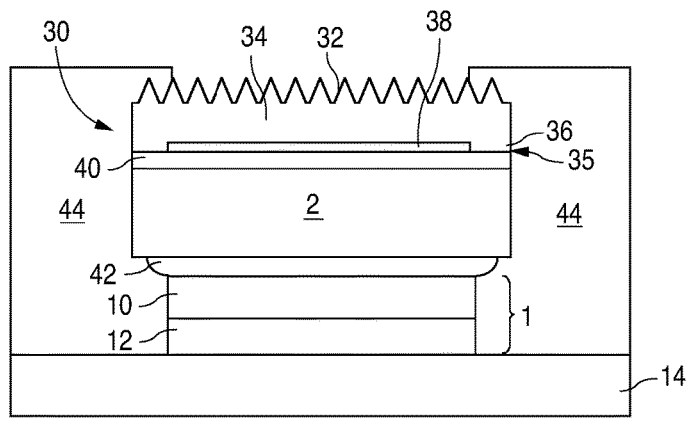
FIG. 2
FIG. 3
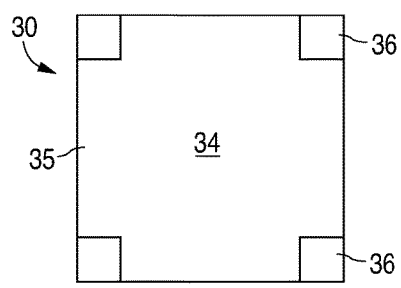
FIG. 4

WAVELENGTH CONVERTED LIGHT EMITTING DEVICE WITH TEXTURED SUBSTRATE

CROSS-REFERENCE TO RELATED APPLICATIONS

The present application claims priority to U.S. Provisional Patent Application No. 62/243,470, filed Oct. 19, 2015. U.S. Provisional Patent Application No. 62/243,470 is incorporated herein.

FIELD OF THE INVENTION

The present invention relates to a wavelength converted light emitted device with a substrate with a textured surface positioned in a path of light extracted from the wavelength converting structure.

BACKGROUND

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

White light may be created by positioning a wavelength converting material in the path of light extracted from an LED. FIG. 1 illustrates one example of a wavelength-converted LED, described in more detail in US 2013/0258634. US 2013/0258634 teaches the device of FIG. 1 "includes a microstructure film formed over a LED and a light conversion material formed over the LED and below the film. The light conversion material can include a layer of photo phosphors which may be directly deposited on the LED or may be placed on or attached to the LED as a layer of a pre-formed film. This structure can be used for white LED light devices where the light conversion material converts the LED light into white light. On the top of the structure of the LED and the light conversion material layer, a layer of a light deflection film with microstructures is formed. Photons emitted from the LED and photons emitted at the phosphors layer due to absorption of LED light interact with the top deflection film and bounce back and forth within the structure to create a light shaping effect where light bounces between the LED and the light deflection film and exits the top deflection film in selected directions that are defined by the microstructures in the deflection film. The deflection film can also effectuate a light focusing effect on the light coming out of the deflection film and the light focusing can depend on the optical index of refraction of the deflection film. The geometry of the deflection film can also affect the light focusing."

SUMMARY

It is an object of the invention to provide a wavelength converted light emitting device with a textured substrate which may at least partially collimate light extracted from the wavelength converting structure.

Embodiments of the invention include a flip chip semiconductor light emitting device and a wavelength converting structure disposed in a path of light extracted from the flip chip semiconductor light emitting device. A substrate with a textured top surface is positioned with the bottom surface facing the wavelength converting structure. The wavelength converting structure is disposed between the substrate and the flip chip semiconductor light emitting device.

Embodiments of the invention include a semiconductor light emitting device and a wavelength converting structure disposed in a path of light extracted from the semiconductor light emitting device. A substrate is disposed in a path of light extracted from the wavelength converting structure. The substrate includes a body and a dielectric layer disposed on the body. A top surface of the dielectric layer is textured.

BRIEF DESCRIPTION OF THE DRAWINGS

FIG. 1 illustrates a prior art structure including an LED die, a light conversion material, and an optics layer.

FIG. 2 is a cross sectional view of an LED.

FIG. 3 is a cross sectional view of a device including an LED, a wavelength converting structure, and a textured substrate.

FIG. 4 illustrates the bottom surface of the textured substrate of FIG. 3.

DETAILED DESCRIPTION

Figure 5:
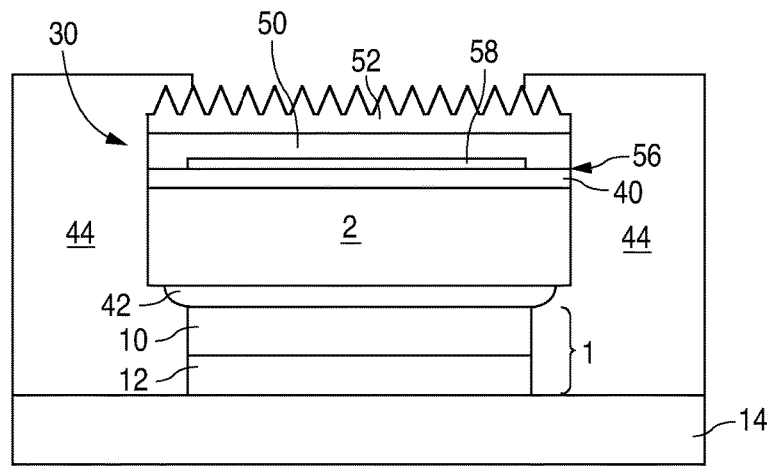
FIG. 5 is a cross sectional view of a device including an LED, a wavelength converting structure, and a substrate including a textured dielectric material grown on a body.

In embodiments of the invention, a wavelength-converted semiconductor light emitting device such as a semiconductor light emitting diode is combined with a substrate with a textured surface.

FIG. 2 illustrates one example of a III-nitride LED. Any suitable semiconductor light emitting device may be used and embodiments of the invention are not limited to the LED illustrated in FIG. 2. Also, though in the examples below the semiconductor light emitting device are III-nitride LEDs that emits blue or UV light, semiconductor light emitting devices besides LEDs such as laser diodes and semiconductor light emitting devices made from other materials systems such as other III-V materials, III-phosphide, III-arsenide, II-VI materials, ZnO, or Si-based materials may be used.

In the device of FIG. 2, a majority of light is extracted from the LED through the growth substrate. Such a device may be referred to as a flip chip device. The LED of FIG. 2 is formed by growing a III-nitride semiconductor structure on a growth substrate 10 as is known in the art. The growth substrate is often sapphire but may be any suitable substrate such as, for example, a non-III-nitride material, SiC, Si, GaN, or a composite substrate. A surface of the growth substrate on which the III-nitride semiconductor structure is grown may be patterned, roughened, or textured before growth, which may improve light extraction from the device. A surface of the growth substrate opposite the growth surface (i.e. the surface through which a majority of light is extracted in a flip chip configuration) may be patterned, roughened or textured before or after growth, which may improve light extraction from the device.

The semiconductor structure includes a light emitting or active region sandwiched between n- and p-type regions. An n-type region 16 may be grown first and may include multiple layers of different compositions and dopant concentration including, for example, preparation layers such as buffer layers or nucleation layers, which may be n-type or not intentionally doped, and n- or even p-type device layers designed for particular optical, material, or electrical properties desirable for the light emitting region to efficiently emit light. A light emitting or active region 18 is grown over the n-type region. Examples of suitable light emitting regions include a single thick or thin light emitting layer, or a multiple quantum well light emitting region including multiple thin or thick light emitting layers separated by barrier layers. A p-type region 20 may then be grown over the light emitting region. Like the n-type region, the p-type region may include multiple layers of different composition, thickness, and dopant concentration, including layers that are not intentionally doped, or n-type layers.

After growth of the semiconductor structure, a reflective p-contact is formed on the surface of the p-type region. The p-contact 21 often includes multiple conductive layers such as a reflective metal and a guard metal which may prevent or reduce electromigration of the reflective metal. The reflective metal is often silver but any suitable material or materials may be used. After forming the p-contact 21, a portion of the p-contact 21, the p-type region 20, and the active region 18 is removed to expose a portion of the n-type region 16 on which an n-contact 22 is formed. The n- and p-contacts 22 and 21 are electrically isolated from each other by a gap 25 which may be filled with a dielectric such as an oxide of silicon or any other suitable material. Multiple n-contact vias may be formed; the n- and p-contacts 22 and 21 are not limited to the arrangement illustrated in FIG. 2. The n- and p-contacts may be redistributed to form bond pads with a dielectric/metal stack, as is known in the art.

In order to electrically and physically attach the LED to another structure, one or more interconnects 26 and 28 are formed on or electrically connected to the n- and p-contacts 22 and 21. Interconnect 26 is electrically connected to n-contact 22 in FIG. 3. Interconnect 28 is electrically connected to p-contact 21. Interconnects 26 and 28 are electrically isolated from the n- and p-contacts 22 and 21 and from each other by dielectric layer 24 and gap 27. Interconnects 26 and 28 may be, for example, solder, stud bumps, gold layers, or any other suitable structure. Many individual LEDs are formed on a single wafer then diced from the wafer of devices. The substrate 10 may be thinned after growth of the semiconductor structure or after forming the individual devices. In some embodiments, the substrate is removed from the device of FIG. 2. A majority of light extracted from the device of FIG. 2 is extracted through the substrate 10 (or the surface of the semiconductor structure exposed by removing the substrate 10). In the following figures, the LED is represented by block 1. The structures formed on the substrate 10, including the semiconductor structure, metal, and dielectric layers, are represented by block 12. Embodiments of the invention are not limited to flip chip LEDs—any suitable device may be used.

In the embodiments described below, a wavelength converting structure may be disposed in the path of light extracted from the light emitting device. The wavelength converting structure includes one or more wavelength converting materials which may be, for example, conventional phosphors, organic phosphors, quantum dots, organic semiconductors, II-VI or III-V semiconductors, II-VI or III-V semiconductor quantum dots or nanocrystals, dyes, polymers, or other materials that luminesce. The wavelength converting material absorbs light emitted by the LED and emits light of one or more different wavelengths. Unconverted light emitted by the LED is often part of the final spectrum of light extracted from the structure, though it need not be. The final spectrum of light extracted from the structure may be white, polychromatic, or monochromatic. Examples of common combinations include a blue-emitting LED combined with a yellow-emitting wavelength converting material, a blue-emitting LED combined with green- and red-emitting wavelength converting materials, a UV-emitting LED combined with blue- and yellow-emitting wavelength converting materials, and a UV-emitting LED combined with blue-, green-, and red-emitting wavelength converting materials. Wavelength converting materials emitting other colors of light may be added to tailor the spectrum of light extracted from the structure. The wavelength converting structure may include light scattering or light diffusing elements such as TiO2.

In some embodiments, the wavelength converting structure is a structure that is fabricated separately from the LED and attached to the LED, for example through wafer bonding or a suitable adhesive such as silicone or epoxy. One example of such a pre-fabricated wavelength converting element is a ceramic phosphor, which is formed by, for example, sintering powder phosphor or the precursor materials of phosphor into a ceramic slab, which may then be diced into individual wavelength converting elements. A ceramic phosphor may also be formed by, for example tape casting, where the ceramic is fabricated to the correct shape, with no dicing or cutting necessary. Examples of suitable non-ceramic pre-formed wavelength converting elements include powder phosphors that are dispersed in transparent material such as silicone or glass that is rolled, cast, or otherwise formed into a sheet, then singulated into individual wavelength converting elements, and phosphor mixed with silicone and disposed on a transparent substrate.

In the following figures, the wavelength converting structure is represented by block 2.

In some embodiments, a wavelength-converted LED is combined with a structure for enhancing the directional emission (i.e., the luminance at a normal to a major surface of the LED), which may increase the luminance of the device. The structure for enhancing the directional emission may be, for example, a textured substrate, as illustrated in FIGS. 3, 5, 6, and 7.

As used herein, "textured" may refer to a surface that is roughened (randomly textured) or patterned (textured in an ordered and/or repeating way). A cross section of the textured surface may include peaks or hills separated by valleys. As illustrated in the following figures, the "peaks" may be triangular in cross section, though this is not required. In some embodiments, the features that form the texturing may be cones, pyramids, truncated cones, truncated pyramids, posts, or any other suitable structure including Johnson solids or near Johnson solids. The bottoms of the features may touch neighboring features, or the features may be spaced apart from each other. The features may be disposed in any array such as, for example, a triangular, square, hexagonal, quasi-crystal, or any other suitable array. The peak-to-peak spacing of the features may be at least 500 nm in some embodiments, at least 5000 nm in some embodiments, and no more than 50 µm in some embodiments.

FIG. 3 is a cross sectional view of one embodiment including a textured substrate 30. In the device of FIG. 3, an LED 1 is attached to a mount 14 such that the substrate 10 is disposed furthest from the mount 14. The mount may be, for example, silicon, ceramic, metal, printed circuit board, or any other suitable material. A wavelength converting structure 2 is disposed in the path of light emitted by LED 1. In some embodiments, wavelength converting structure 2 is formed directly on LED 1. In some embodiments, wavelength converting structure 2 is formed separately from LED 1 and attached to substrate 10 of LED 1 by any suitable technique including wafer bonding and gluing with an adhesive layer 42. Adhesive layer 42 may be any suitable material that adheres wavelength converting structure to LED 1, is transparent, and does not significantly degrade when exposed to the operating conditions of LED 1, and when exposed to light extracted from LED 1 and wavelength converting structure 2. Silicone, epoxy, glass, and non-III-nitride materials are examples of suitable adhesives 42.

A textured substrate 30 is disposed in the path of light extracted from wavelength converting structure 2, such that wavelength converting structure 2 is disposed between LED 1 and substrate 30. The top surface of substrate 30 (i.e. the surface of the substrate 30 from which a majority of light is extracted from the substrate) is a textured surface 32. The substrate 30 may be at least 100 µm thick in some embodiments, no more than 300 µm thick in some embodiments, and 200 µm thick in some embodiments. The textured portion may have a depth of at least 1 µm in some embodiments and no more than 10 µm in some embodiments. The bottom surface of substrate 30 is positioned proximate wavelength converting structure 2. In some embodiments, substrate 30 is attached to wavelength converting structure 2 by any suitable technique including wafer bonding and gluing with an adhesive layer 40. Suitable adhesives may be the same as described above for adhesive layer 42. Adhesive layers 40 and 42 may be the same material or different materials.

In some embodiments, substrate 30 is formed and/or attached to wavelength converting structure 2 such that a gap 38 is formed between wavelength converting structure 2 and substrate 30. Gap 38 may be filled with air, ambient gas, or any other suitable material. Gap 38 may be at least 10 µm thick in some embodiments and no more than 200 µm thick in some embodiments.

Light may be collimated by gap 38. Light exiting the structure travels from a high index region (for example, wavelength converting structure 2, which may be YAG:Ce, having a refractive index of at least 1.8) to a low index region (for example, air in gap 38, having a refractive index of 1), to a second high index region (for example, substrate 30, which may be sapphire, having a refractive index of at least 1.7). Since light at only certain incidence angles is able to pass through an interface of materials with different indices of refraction without undergoing total internal reflection, the interface collimates the light. The higher the refractive index contrast, in particular between the low index region and the second high index region, the greater the collimation effect, though greater collimation may come at the cost of lower transmission. The difference in index of refraction between the high index regions (the substrate 10 and the textured substrate 30) and the low index region (the material in gap 38) is at least 0.5 in some embodiments, and at least 0.6 in some embodiments.

In some embodiments, gap 38 is formed by placing adhesive 40 only at one or more edges of the wavelength converting structure 2, leaving gap 38 where adhesive 40 is not placed. In such embodiments, substrate 30 may have a planar bottom surface.

In some embodiments, the bottom surface 35 of substrate 30 is formed to create a gap 38, as illustrated in FIG. 4. On the bottom surface 35 of substrate 30 illustrated in FIG. 4, the substrate 30 is shaped by any suitable technique such as, for example, masking and etching or mechanical processes such as grinding, to form one or more pillars 36. In the embodiment illustrated in FIG. 4, four square pillars 36 are disposed at the corners of the substrate 30. More or fewer pillars may be used, the pillars may be placed in different places, including away from the edges of the substrate 30. The pillars need not be square as illustrated, they may be any suitable shape. On the rest of the bottom surface 35, in the region 34 between pillars 36, the bottom of the substrate is recessed relative to the pillars. In other words, the substrate 30 is thicker where pillars 36 are formed, and thinner in region 34 without pillars. When the substrate is attached to wavelength converting structure 2 or adhesive 40, only the pillars 36 are in direct contact with wavelength converting structure 2 or adhesive 40, leaving gap 38. Pillars 36 may be any suitable size and shape. In one example, pillars 36 are no more than 50 µm×50 µm wide, and are between 10 µm and 200 µm tall.

Substrate 30 may be any suitable material that is transparent, does not significantly degrade when exposed to the operating conditions of LED 1, and when exposed to light extracted from LED 1 and wavelength converting structure 2, and suitable for forming the textured surface and pillars on the bottom surface. In some embodiments, substrate 30 may have a refractive index of at least 1.5. Examples of suitable materials include sapphire and glass.

The textured surface 32 and the pillars 36 and gap 38 on the bottom of substrate 30 may be formed by any suitable technique including, for example, masking and etching and mechanical techniques such as grinding.

Figure 8:
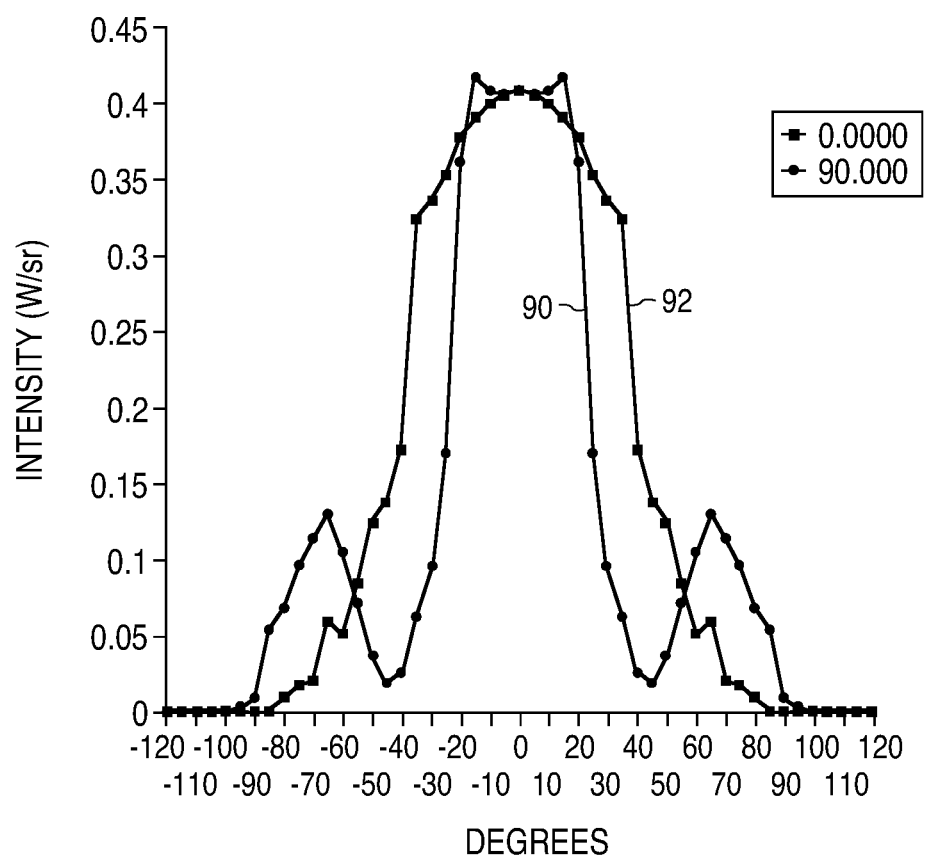
FIG. 8 is a plot of cross sectional far-field intensity for a device with a textured substrate.

FIG. 8 illustrates a cross section of the far field intensity, for a device as illustrated in FIG. 3 (curve 90) and a device without a textured substrate (curve 92). As illustrated in FIG. 8, light extracted from the device illustrated in FIG. 3 is more collimated than light extracted from the reference device without the textured substrate. In some applications, the light may be more collimated in only some planes. For example, in the example of an automotive headlight, the collimated curve illustrated in FIG. 8 may represent light emitted along a plane perpendicular to the road. The light beam horizontal to the road may still be wide.

In some embodiments, reflective material is disposed on the sides of one or more of LED 1, wavelength converting structure 2, and substrate 30. In the embodiment illustrated in FIG. 3, reflective material 44 is disposed on the sides of all three structures. In some embodiments, reflective material may be disposed on the sides of only LED 1 and/or wavelength converting structure 2, or the reflective material may be disposed on a portion of the sidewalls of any of the three structures. The reflective material 44 may be, for example, $TiO_2$ disposed in a transparent material such as silicone, a reflective coating or foil such as a metal foil or reflective paint that is disposed on the sidewalls, or any other suitable material. The reflective material 44 may be molded over the structure including the LED 1, the wavelength converting structure 2, and the textured substrate 30, pressed over the structure, or formed by any other suitable technique. Excess reflective material disposed over the top of textured surface 32 may be removed by, for example, bead blasting or any other suitable technique.

Figure 6:
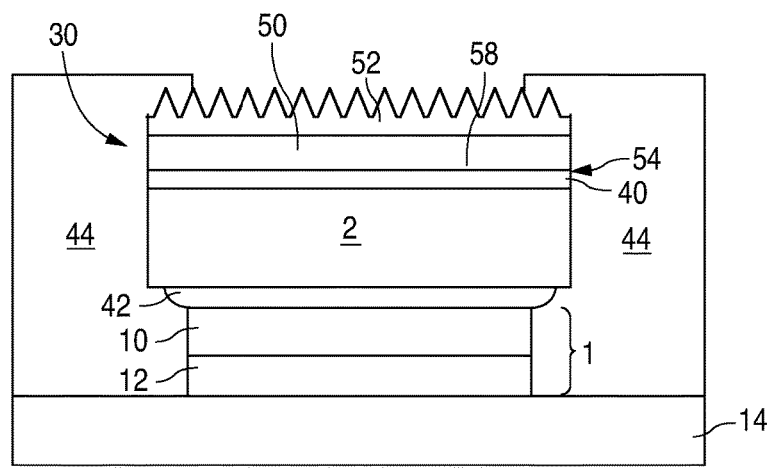
FIG. 6 is a cross sectional view of the device of FIG. 5 without a gap between the substrate and the wavelength converting structure.

FIGS. 5 and 6 are cross sectional views of other embodiments including textured substrates. The LED 1, mount 14, wavelength converting structure 2, adhesive layers 40 and 42, and reflective material 44 in FIGS. 5 and 6 may be the same as described above in reference to FIG. 3.

In the devices of FIGS. 5 and 6, the substrate 30 includes a body 50 and a dielectric layer 52. The top surface of dielectric layer 52 is textured. The textured surface of dielectric layer 52 may have the same shapes and dimensions as described above in reference to FIG. 3. Dielectric layer 52 may be grown or otherwise deposited on a major surface of body 50. The surface of body 50 on which dielectric layer 52 is formed may be planar or may itself be textured (not shown).

In some embodiments, body 50 is transparent, suitable for forming and patterning the dielectric layer 52, and as inexpensive as possible. In some embodiments, body 50 and dielectric layer 52 are selected to have relatively high indices of refraction, at least 2 in some embodiments. In some embodiments, body 50 is a non-III-nitride material such as sapphire, and dielectric layer 52 is an undoped III-nitride material such as GaN. The GaN layer may be grown on the sapphire body, then roughened or patterned using any suitable technique such as, for example, a mechanical technique such as grinding, masking and etching, or a technique that forms a randomly textured surface such as photoelectrochecmical etching. The GaN layer 52 typically does not include a light emitting layer.

In the embodiment illustrated in FIG. 5, at the bottom surface 56 of body 50, a gap 58 is formed between the body 50 and adhesive layer 40 if used, or wavelength converting structure 2 if no adhesive layer is used. The gap may be the same as and formed in the same way as the gap described above in reference to FIG. 3. In FIG. 6, there is no gap. In FIG. 6, the top surface of wavelength converting structure 2 and the bottom surface of body 50 are both planar surfaces.

Figure 7:
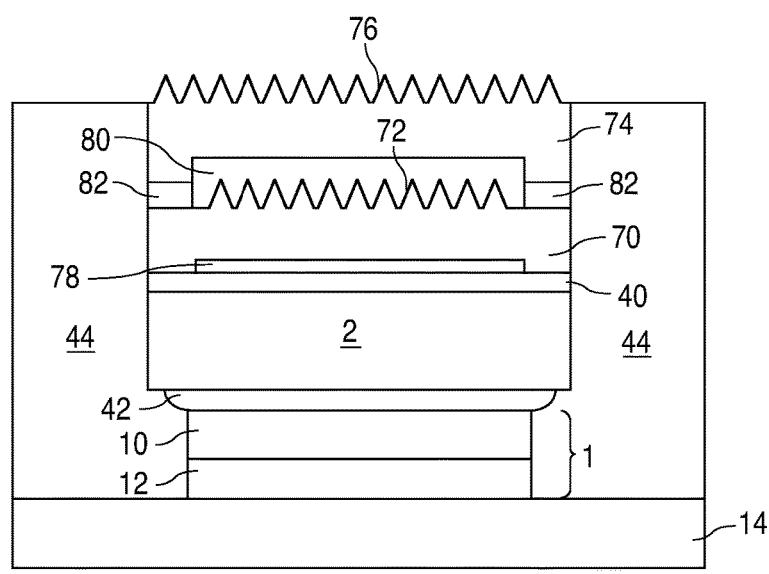
FIG. 7 is a cross sectional view of a device including multiple textured substrates.

In the embodiment illustrated in FIG. 7, multiple substrates with textured top surfaces are disposed over an LED and wavelength converting structure. The LED 1, mount 14, wavelength converting structure 2, adhesive layers 40 and 42, and reflective material 44 in FIG. 7 may be the same as described above in reference to FIG. 3. The substrates may be textured substrates, as described above in reference to FIG. 3, or substrates including a body and a textured dielectric layer, as described above in reference to FIGS. 5 and 6.

A first substrate 70 is attached to wavelength converting structure 2, for example through an adhesive layer 40. At least a portion of the top surface 72 of first substrate 70 is textured. A second substrate 74 is attached to the first substrate 70. The top surface 76 of the second substrate 74 is textured. The second substrate 74 may be attached to the first substrate by an adhesive 82, or by any other suitable method or material.

In some embodiments, second substrate 74 is formed like the substrate described in FIG. 3, with one or more pillars on the bottom surface which form a gap 80 between the first and second substrates. The top surface 72 of the first substrate 70 may be textured such that the regions where the pillars on the second substrate 74 touch the top surface 72 of the first substrate 70 are not textured, or the pillars may be placed on the textured surface 72. Adhesive 82 may be disposed in the region of the pillars on the bottom surface of second substrate 74, in order to attach the first substrate 70 to the second substrate 74. In the embodiment illustrated in FIG. 7, gaps 78 and 80 are formed between the wavelength converting structure 2 and the first substrate 70, and between the first substrate 70 and the second substrate 74. Either or both gaps 78 and 80 may be omitted.

Having described the invention in detail, those skilled in the art will appreciate that, given the present disclosure, modifications may be made to the invention without departing from the spirit of the inventive concept described herein. In particular, features described in a specific embodiment may be incorporated in any embodiment, and features may be omitted from embodiments. Therefore, it is not intended that the scope of the invention be limited to the specific embodiments illustrated and described.

The invention claimed is:

1. A light emitting device comprising:
a semiconductor light emitting structure;
a wavelength converting structure comprising a planar light output surface facing away from the semiconductor light emitting structure, the wavelength converting structure arranged to absorb light emitted by the semiconductor light emitting structure and in response emit longer wavelength through the planar light output surface;
a transparent substrate comprising a planar light input surface arranged parallel to and facing the planar light output surface of the wavelength converting structure, and oppositely position textured light output surface facing away from the wavelength converting structure, and pillars extending away from the planar light input surface of the transparent substrate toward the planar light output surface of the wavelength converting structure, the pillars attached to the wavelength converting structure and defining a gap between the planar light input surface of the transparent substrate and the planar light output surface of the wavelength converting structure; and
a transparent material disposed in an filling the gap between the planar light input surface of the transparent substrate and the planar light output surface of the wavelength converting structure, the transparent material having an index of refraction lower than an index of refraction of the wavelength converting structure and lower than an index of refraction of the transparent substrate.

2. The light emitting device of claim 1, wherein the transparent material disposed in and filling the gap is or comprises air.

3. The light emitting device of claim 1, wherein the index of refraction of the transparent material disposed in and filling the gap is at least 0.5 less than the index of refraction of the transparent substrate and at least 0.5 less than the index of refraction of the wavelength converting material.

4. The light emitting device of claim 1, wherein the gap has a width perpendicular to the light output surface of the wavelength converting structure of greater than or equal to 10 microns and less than or equal to 200 microns.

5. The light emitting device of claim 1, wherein the transparent substrate textured light output surface partially collimates light entering the transparent substrate from the wavelength converting structure and exiting the transparent substrate through the transparent substrate textured light output surface.

6. The light emitting device of claim 1, wherein the transparent substrate textured light output surface comprises features arranged in an array with a spacing between features of greater than or equal to 50 nanometers and less than or equal to 500 nanometers.

7. The light emitting device of claim 6, wherein the features have shapes selected from the group consisting of posts, pyramids, cones, truncated pyramids, truncated cones, and any Johnson slid.

8. The light emitting device of claim 1, wherein the transparent substrate is sapphire, and the transparent substrate textured output surface is a textured sapphire surface.

9. The light emitting device of claim 1, wherein the transparent substrate comprises a sapphire block and a textured layer of high refractive index material disposed on the sapphire block, and the transparent substrate textured light output surface is a surface of the textured layer of high refractive index material.

10. The light emitting device of claim 9, wherein the high refractive index material is a III-nitride material.

11. The light emitting device of claim 9, wherein the high refractive index material is GaN.

12. The light emitting device of claim 1, wherein the transparent substrate is a first transparent substrate, comprising:
   a second transparent substrate arranged with a light input surface of the second transparent substrate facing toward the first transparent substrate textured light output surface and an oppositely positioned textured light output surface facing away from the first transparent substrate, a first portion of the second transparent substrate light input surface attached to the first transparent substrate and a second portion of the second transparent substrate light input surface spaced apart from the first transparent substrate textured light output surface, the second portion of the second transparent substrate light input surface and the first transparent substrate textured light output surface defining a gap between the second transparent substrate and the first transparent substrate; and
   a second transparent material disposed in and filling the gap between the second transparent substrate and the first transparent substrate, the second transparent material having an index of refraction lower than an index of refraction of the second transparent substrate and lower than an index of refraction of the first transparent substrate.

13. The light emitting device of claim 12, wherein the second transparent material disposed in and filling the gap between the second transparent substrate and the first transparent substrate is or comprises air.

14. The light emitting device of claim 12, the index of refraction of the second transparent material disposed in and filling the gap between the second transparent substrate and the first transparent substrate is at least 0.5 is at least 0.5 less than the index of refraction of the first transparent substrate and at least 0.5 less than the index of refraction of the second transparent substrate.

15. The light emitting device of claim 1, wherein:
   the transparent material disposed in and filling the gap is or comprises air; and
   the gap has a width perpendicular to the light output surface of the wavelength converting structure of greater than or equal to 10 microns and less than or equal to 200 microns.

16. The light emitting device of claim 15, wherein the second portion of the transparent substrate light input surface and the wavelength converting structure light output surface are parallel.

17. The light emitting device of claim 15, wherein the transparent substrate textured light output surface comprises features arranged in an array with a spacing between features of greater than or equal to 50 nanometers and less than or equal to 500 nanometers.

18. The light emitting device of claim 17, wherein the transparent substrate is sapphire, and the transparent substrate textured output surface is a textured sapphire surface.

19. The light emitting device of claim 17, wherein the transparent substrate comprises a sapphire block and a textured layer of high refractive index material disposed on the sapphire block, and the transparent substrate textured light output surface is a surface of the textured layer of high refractive index material.

* * * * *